United States Patent
Nanda et al.

(10) Patent No.: US 7,382,300 B1
(45) Date of Patent: Jun. 3, 2008

(54) SYSTEM-ON-CHIP (SOC) INTEGRATED CIRCUIT INCLUDING INTERLEAVED DELTA-SIGMA ANALOG-TO-DIGITAL CONVERTER (ADC)

(75) Inventors: Kartik Nanda, Austin, TX (US); John L. Melanson, Austin, TX (US); Timothy Thomas Rueger, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/564,331

(22) Filed: Nov. 29, 2006

(51) Int. Cl.
*H03M 3/00* (2006.01)
(52) U.S. Cl. .................................. 341/143; 341/144
(58) Field of Classification Search ................ 341/143, 341/144, 155, 123
See application file for complete search history.

(56) References Cited

U.S. PATENT DOCUMENTS

| | | | |
|---|---|---|---|
| 5,625,359 A * | 4/1997 | Wilson et al. | ............... 341/143 |
| 6,091,349 A | 7/2000 | Chadha et al. | |
| 6,469,650 B2 | 10/2002 | Nanda et al. | |
| 6,738,004 B2 | 5/2004 | Melanson | |
| 6,940,435 B2 * | 9/2005 | Laamanen | ................... 341/143 |
| 6,950,044 B1 | 9/2005 | Piaseki et al. | |
| 7,190,197 B1 | 3/2007 | You et al. | |

OTHER PUBLICATIONS

U.S. Appl. No. 11/297,016, filed Dec. 8, 2005, Melanson, et al.
U.S. Appl. No. 11/297,011, filed Dec. 8, 2005, Melanson.
Robert, et al., "A Second-Order High-Resolution Incremental A/D Converter with Offset and Charge Injection Compensation", IEEE JSSC, vol. 23, No. 3, Jun. 1988.
Quinquempoix, et al., "A Low-Power 22-bit Incremental ADC with 4ppm INL, 2ppm Gain Error and 2uV DC Offset", Proceedings of ESSCIRC, Grenoble, FR 2005.
U.S. Appl. No. 11/864,876, filed Sep. 28, 2007, Singh, et al.

* cited by examiner

*Primary Examiner*—Brian Young
(74) *Attorney, Agent, or Firm*—Andrew M. Harris; Mitch Harris, Atty at Law, LLC

(57) ABSTRACT

A system-on-chip (SoC) integrated circuit including an interleaved delta-sigma analog to digital converter (ADC) provides for reduced noise in the ADC conversions. The ADC is operated intermittently and the balance of the digital circuits forming the system are halted while the conversions take place. The halted portion of the system may include an output low-pass filter of the ADC. The system may include a processor core or other logic having a clock frequency unrelated to the ADC modulator clock frequency that is not otherwise clock-managed to reduce noise induced in the converter output by the operation of the core or other logic.

26 Claims, 5 Drawing Sheets

SYSTEM-ON-CHIP (SOC) INTEGRATED CIRCUIT INCLUDING INTERLEAVED DELTA-SIGMA ANALOG-TO-DIGITAL CONVERTER (ADC)

CROSS-REFERENCE TO RELATED APPLICATIONS

The present application is related to co-pending U.S. patent application Ser. No. 11/534,191, entitled "DELTA-SIGMA MODULATOR HAVING QUANTIZER CODE PATTERN DETECTION CONTROLLED DITHER" and U.S. patent application Ser. No. 11/534,195 entitled "DELTA-SIGMA MODULATOR HAVING QUANTIZER CODE PATTERN DETECTION CONTROLLED DITHER", both filed on Sep. 21, 2006, having at least one common inventor, and assigned to the same assignee. The above-referenced U.S. patent applications are incorporated herein by reference.

BACKGROUND OF THE INVENTION

1. Field of the Invention

The present invention relates generally to analog-to-digital converters, and more specifically, to an on-chip system including a delta-sigma analog-to-digital converter (ADC) that is operated intermittently while the remainder of the system is halted to reduce noise.

2. Background of the Invention

System-on-Chip (SoC) integrated circuits are ubiquitous in embedded applications such as household devices, personal computers and industrial electronics. SoCs reduce the cost of systems and increase their performance by reducing the parts count and decreasing the number of interconnects required to implement a given device. SoCs frequently include analog conversion components such as ADCs and digital-to-analog converters (DACs) in order to provide a system interface to analog signals, perform analog measurements and to provide analog outputs.

Delta-sigma modulator based analog-to-digital converters (ADCs) are in widespread use and are particularly desirable for use in SoC circuits. SoC circuit are typically either entirely digital or are mixed-signal with some analog circuits, but having at least one large-scale digital logic block, such as a processor core. Delta-sigma modulator based ADCs typically have relatively low analog circuit performance requirements and small analog circuit area. Therefore, they are ideal for mixed-signal circuits in which analog and digital signals and components coexist.

The delta-sigma modulator based ADC typically includes an analog loop filter that receives an input signal and a quantizer that converts the analog output of the loop filter to a digital representation. A feedback signal provided from the output of the quantizer is introduced to the analog loop filter to close the loop such that the average output of the quantizer is equal to the value of the input signal. The output of the quantizer is then filtered by a low-pass digital filter having a large number of taps, in order to provide an accurate conversion result from the quantizer output, which typically includes thousands of values per conversion cycle.

Since the operation of the delta-sigma modulator based ADC as described above is a quasi-continuous process within both the loop filter and the digital low-pass filter at the output, delta-sigma modulator based ADCs are typically operated continuously, unlike so-called "flash" ADCs or successive-approximation ADCs, which can be used to acquire a single sample and then be shut down between sampling/conversion cycles. Interrupting the operation of the converter between samples will cause disruption of the operation of the analog loop filter. Therefore delta-sigma modulator based ADCs are typically designed to operate continuously producing a sample value at the end of a period corresponding to the sampling rate.

In an SoC design, the ADC typically coexists with a large amount of digital logic, which typically implements a processor core or a dedicated signal processing circuit. Such circuits generate a large amount of switching noise on power supply rails of the integrated circuit, as well as generating noise on signal lines within the ADC portion of the integrated circuit that affect the converter output values. The noise level at the ADC input affects the useful resolution of the converter and is typically manageable only by adjusting the circuit layout and "managing" the timing of the digital switching signals so that all of the transitions occur over a small portion of the ADC conversion cycle. The highest frequency digital circuit clocks are typically the signals that are managed, as those clocks are responsible for the majority of the noise generated in the analog circuits.

However, digital circuits that are operated with an asynchronous clock with respect to the converter clock, and those that have some level of asynchronous operation, such as processors, which are affected by program flow as well as clock state cannot be managed in the manner described above, as logic transitions can and will occur at any point in the ADC conversion cycle. Further, when a processor core instruction rate is much higher than the converter sample rate, the various phases of instruction processing will lie throughout the conversion cycle and cannot be held to just a small window without affecting performance of the core.

Therefore, it would be desirable to provide an SoC including a delta-sigma ADC that can be operated in a manner that reduces or eliminates the noise generated in during analog signal conversions by a processor core or other digital circuit.

SUMMARY OF THE INVENTION

The above stated objective of reducing or eliminating the noise generated in SoC-integrated delta-sigma ADCs by other digital circuits such as processor cores, is realized in an SoC integrated circuit including a delta-sigma analog-to-digital converter circuit, and a method of operation.

The SoC integrated circuit includes a delta-sigma modulator for receiving an analog input signal and providing a quantized digital output stream from a digital output, a digital filter for filtering the digital output stream to produce ADC sample values, digital logic for receiving output sample values from the digital filter, and control logic for controlling operation of the delta-sigma modulator and the digital logic. The digital logic may comprise a processor core and the control logic may be, at least in part, implemented by logic within the processor core and/or a power down instruction executed by the processor core and a wake-up circuit within or external to the processor core.

The control logic alternately operates the ADC and the digital logic so that noise generated by the digital logic is eliminated during at least some portion of the ADC conversion cycle. The analog loop filter of the modulator is reset and re-enabled a predetermined time period before the modulator is operated, so that the loop filter and feedback value supplied from the quantizer to the loop filter are stable prior to each conversion.

The digital filter may be a half-filter, with a peak time-domain window function coefficient at the beginning of the response, or otherwise implemented such that the earlier half of the time-domain window function has a greater amplitude than the later half. An adaptive dither circuit may be included that detects an unchanging series of values from the quantizer and increases the magnitude of a dither signal applied to the quantizer to reduce the impact of restarting the delta-sigma modulator.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses a method and apparatus for reducing or eliminating noise generated by digital circuits in a system-on-chip (SoC) in analog values sampled by a delta-sigma modulator-based analog-to-digital converter (ADC) integrated within the SoC integrated circuit. Rather than operating the modulator continuously, as is typical in prior art converters, the modulator is operated intermittently. The modulator is operated for an interval in which a sample is collected, during which digital circuits other than those required to support the ADC measurement are shut down.

The modulator is reset between conversions so that consistent startup is maintained for each conversion cycle. A digital filter that collects the quantizer outputs of the modulator into a single sample value is operated during the conversion cycle, as well as control logic required to operate the modulator and quantizer. However, large-scale digital circuits included in the SoC such as processor cores, memory, peripherals such as network or bus interfaces are shut down. If a second low-pass filter is employed to further filter the samples provided by the ADC, the second low-pass filter may be shut down during conversion, as well.

Since the modulator is reset between conversions, the output digital low-pass filter may be implemented as a half-filter having a time-domain window function peak substantially near the beginning of the conversion, rather than near the center since one of the features of the present invention is that the modulator starts operation at a predetermined state. A dither circuit may be included to prevent long sequences of unchanging codes that may otherwise be produced during modulator startup. The dither magnitude may be adjusted in response to detecting such long sequences of unchanging codes, so that the converter may be under-dithered except when it is in a state where the output code is unchanging.

Figure 1:
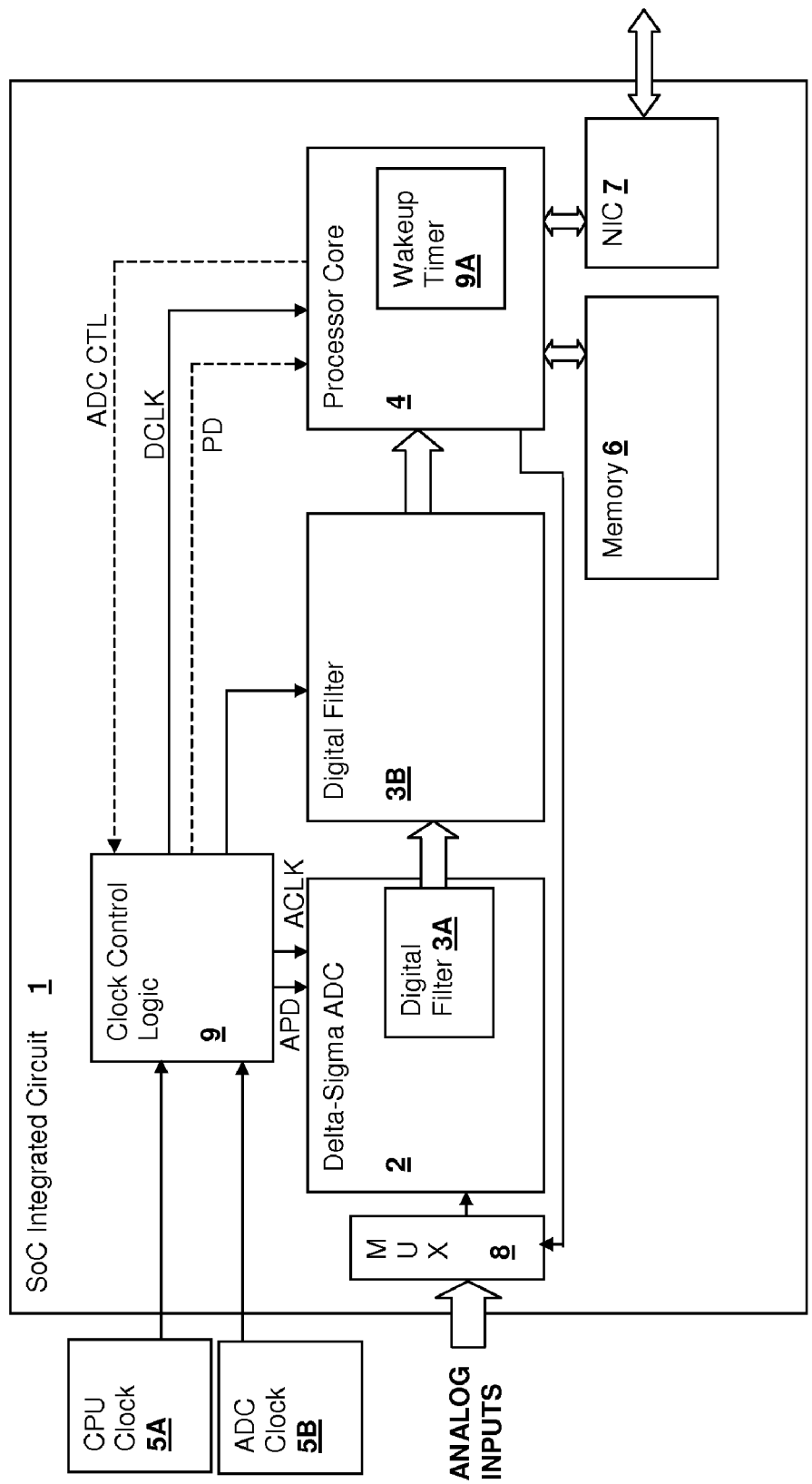
FIG. 1 is a block diagram depicting an SoC integrated circuit in accordance with an embodiment of the present invention.

Referring now to FIG. 1, an SoC integrated circuit 1 in accordance with an embodiment of the present invention is shown. SoC integrated circuit 1 includes a delta-sigma ADC 2, including a first digital filter 3A that has an output coupled to a second digital filter 3B. A multiplexer 8 is included to select from among multiple analog input signals for conversion by delta-sigma ADC 2. A processor core 4 receives the output of second digital filter 3B and performs further operations on the output of second digital filter 3B that are directed by program instructions stored in a memory 6. Such operations may include, for example, signal processing operations, data manipulation, control of peripherals, and transmission of resultant values to other devices. For example, a network interface controller (NIC) 7 is coupled to processor core 4 for communication with SoC integrated circuit 1 and communication of values received from digital filter 3B and/or control of external devices coupled to NIC 7 can be made in conformity with measurements of analog signals selected by multiplexer 8.

The depicted SoC integrated circuit 1 is only one example of an integrated circuit to which techniques of the invention may be applied. Other integrated circuits having significant digital elements and consequent generated noise will also benefit from application of the techniques of the present invention. For example, processor core 4, memory 6 and NIC 7 may be replaced in another embodiment by a dedicated digital logic circuit connected by a bus interface to external devices. In yet another embodiment, second digital filter 3B may be the only digital circuit for which generated noise is being eliminated from the ADC measurements, and second digital filter 3B may be coupled directly via an interface to devices external to the integrated circuit.

SoC integrated circuit 1 is illustrated as receiving the outputs of two clock generators. A CPU clock generator 5A provides the clock input to processor core 4 via a clock control logic circuit 9, and a separate ADC clock generator 5B provides the clock to a delta-sigma ADC 2, also via clock control logic circuit 9. The clock connection to digital filter 3B can be derived from either clock source, depending on the desired design and timing characteristics. Clock control logic 9 interleaves the operation of ADC 2 with the operation of the digital logic comprising processor core 4, memory 6, and NIC 7, and digital filter 3B so that the digital logic is not operated while the modulator of ADC 2 is being clocked to provide converter output values. Generally, ADC 2 will be halted while the digital logic comprising processor core 4, memory 6, and NIC 7, and digital filter 3B is operated, but that is not required to practice the present invention. A practical ratio of operating periods is 1:9, with processor core 4 executing for periods equal to nine times the conversion period of ADC 2.

Depending on the type of digital circuits from which generated noise is being managed or eliminated, a variety of control options for implementing clock control logic 9 may be employed. In particular, at least a portion of clock control logic 9 can be implemented by processor core 4 in the depicted embodiment. Therefore, power down signal PD is shown as an optional signal provided by clock control logic 9 to processor core 4 and ADC control signal ADC CTL is shown as an optional signal provided from processor core 4 to clock control logic 9. If processor core 4 is a completely static core, i.e., if clock signal CLK can be interrupted at any time during operation of processor core 4, then clock control logic 9 may merely gate off clock signal CLK during the operating period of delta-sigma ADC 2.

However, if processor core 4 is not completely static, or if it is desired that the initiation of measurements by delta-sigma ADC 2 be synchronous with respect to the program cycle state of processor core 4, signal PD is provided to signal processor core to either disable its internal clock synchronously, or to otherwise halt signal processor core 4 to halt operation. For example, signal PD could be connected to an interrupt input that causes processor core 4 to execute program code performing whatever state-saving actions are necessary and then execute a power down instruction. The program instructions may also activate a wake-up timer 9A which may be located external to processor core 4 that will cause resumption of execution by processor core 4 once the ADC measurement has been completed. Therefore, in one embodiment of the invention, CPU clock 5A can be directly connected to processor core 4, and the PD and CLK signals omitted, so that processor core provides all of the control logic managing the interleave of the processor core 4 with delta-sigma ADC 2 operation. The interleave control is provided via an ADC CTL signal, which enables and disables the operation of delta-sigma ADC 2 under control of processor core 4.

Clock control logic 9 is illustrated as providing an ADC clock signal ACLK and an ADC control signal APD to delta-sigma ADC 2, but from the above description, it is understood that ADC control may be performed in conformity with a signal provided directly from processor core 4. Additionally, signal ACLK may be interrupted by clock control logic 9 in order to control operation of delta-sigma modulator 2, or may be provided continuously and delta-sigma modulator 2 may either continue running while processor core 4 is operating or may interrupt its operation internally in conformity with the state of ADC control signal APD.

The illustrated dual-source clocking scheme is illustrated to point out a particular problem solved by the present invention. When CPU clock 5A, used to cause state changes in digital logic circuits of SoC 1, is asynchronous with ADC clock 5B, used to clock delta-sigma ADC 2, clock management is not possible. In such configurations, the present invention prevents noise generated by the digital circuits (e.g., processor core 4, memory 6, and NIC 7) from affecting the measurements made by delta-sigma ADC 2, since those circuits are not operated during the ADC conversion cycle. Even in configuration in which a single clock is supplied to SoC 1, the present invention can obviate the necessity of applying clock management schemes to reduce the impact of generated noise, by preventing any state changes from occurring in the digital circuits outside of delta-sigma ADC 2.

Figure 2:
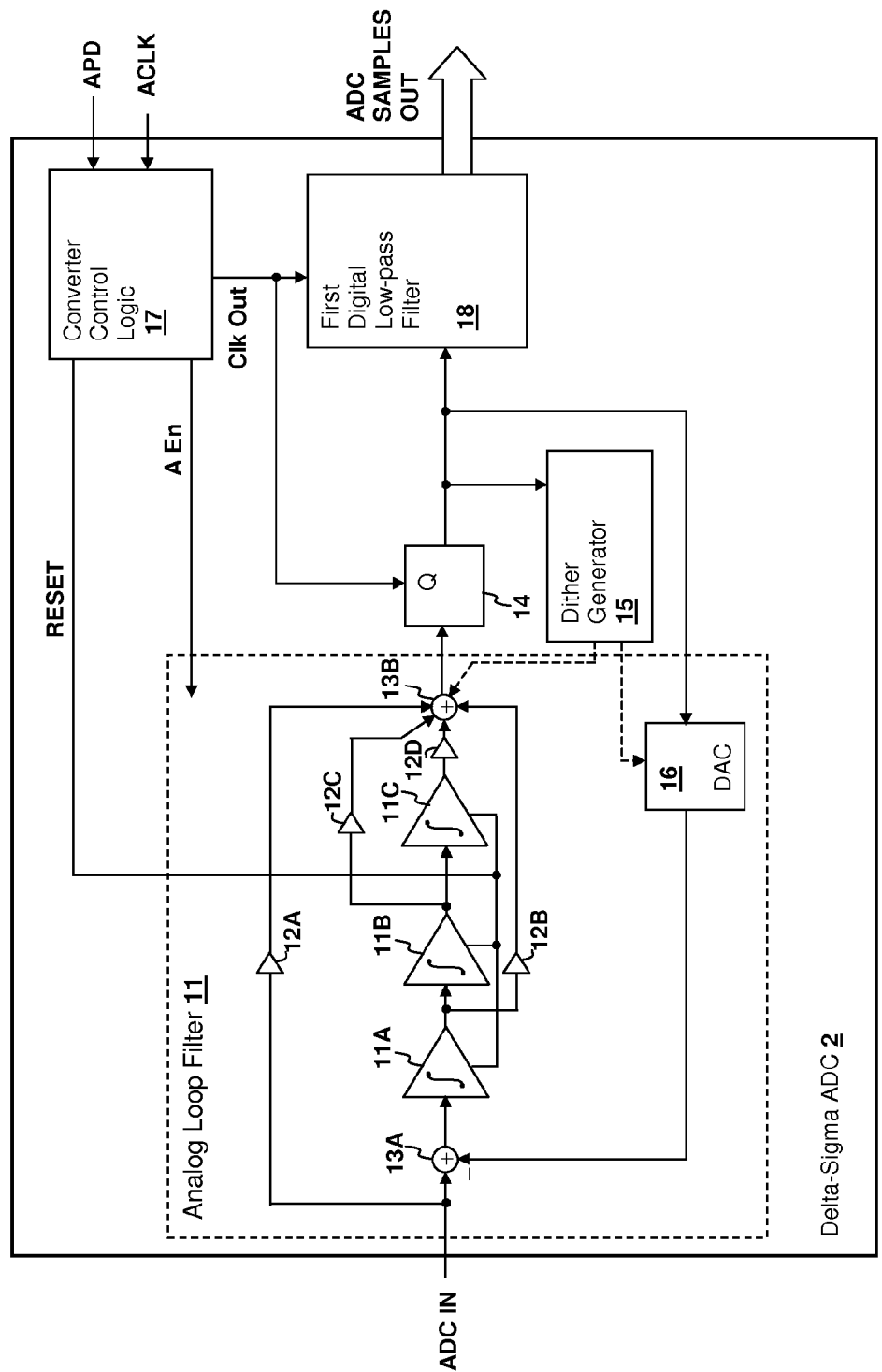
FIG. 2 is a block diagram depicting details of ADC 2 of FIG. 1.

Referring now to FIG. 2, details of delta-sigma ADC 2 are shown. An ADC IN signal provided from multiplexing sample/hold circuit 8 is converted to a digital output provided from first digital low-pass filter 18 as digital signals ADC SAMPLES OUT. Converter control logic 17 supplies clock signals to first digital low pass filter 18 and a quantizer 14 of delta-sigma ADC 2, and in discrete-time implementations of an analog loop filter 11 of delta-sigma ADC 2, also provides clocks to other portions of delta-sigma ADC 2.

Analog loop filter 11 is a feed-forward third-order loop filter design, which may be a continuous-time analog filter or may be a switched-capacitor filter. There are advantages to implementing analog loop filter 11 as a discrete-time circuit as will be pointed out in further detail below. However, it is understood that with appropriate additional isolation switching elements, analog loop filter 11 of the ADC circuit of the present invention may be implemented as a continuous-time analog filter. A series of cascaded integrators 11A-11C receive at a first integrator stage 11A, a signal representing the difference between the input signal selected by multiplexing sample/hold circuit 8 and a feedback signal provided by a digital-to-analog converter (DAC) 16 that converts the output of quantizer 14 to an analog signal. The output of quantizer 14 is also supplied to digital low-pass filter 18, which attenuates the quantization noise introduced by delta-sigma modulator 10.

A set of feed-forward signal paths are provided through scalers 12A-12D and are summed by a summer 13B that provides an analog input to quantizer 14. When a clock signal is applied to quantizer 14, the feedback signal provided by DAC 16 closes the loop around delta-sigma modulator 10, enforcing the condition that the time-average output of quantizer represents the selected input signal. A dither generator 15 provides a dither signal to quantizer 14 and receives a signal from a dither generator 15. Dither generator 15 increases the amplitude of the dither applied to summer 13B (or alternatively to an input of DAC 16) if a repetitive sequence of codes indicates that the feedback value and the input signal are equal or close to equal in value and therefore are reducing the noise-shaping action of the modulator by not changing the output of quantizer 14.

Converter control logic 17 controls the clock signals and optionally the power supply distribution within delta-sigma ADC 2, so that delta-sigma modulator 2 can be halted to save power when not gathering an input sample. Further, converter control logic 17 provides signals for resetting analog loop filter 11 prior to each conversion cycle, since delta-sigma ADC 2 is operated intermittently. Clock signal Clk Out is a burst clock signal that produces a burst of clocks required for a single sample conversion cycle. The duty factor of the burst is the ratio of the sample conversion period to the sample rate period, which controls the amount of time that processor core 4 (or another digital circuit) operates between conversion cycles. Generally, a duty factor of around 10% provides a suitable balance between impact on processor core 4 throughput and any overhead required to enter and exit the halted state versus the reduction in the number of quantizer periods used to gather an ADC sample, which affects the usable resolution of delta-sigma ADC.

When a sample conversion period is complete, converter control logic 17 may disable the analog power supplies to analog loop filter 11 by disabling an analog circuit enable signal A En provided to analog loop filter 11. Analog circuit enable signal A En is re-enabled several modulator clock cycles prior to clocking quantizer 14, for example 10 clock cycles, so that integrators 11A-11C, summers 13A-13B, scalers 12A-12D, and DAC 16 have stable outputs prior to re-applying clocks to quantizer 14, i.e., before the start of the next ADC clock burst. The clock signal supplied to first digital low-pass filter 18 may also be halted after filtering of the conversion data provided during the clock burst is complete. A RESET signal is also supplied to analog loop filter 11 from converter control logic 17, which causes integrators 11A-11C to be held in a reset state until the conversion is started.

Digital low-pass filter 18 may implement a traditional symmetrical time-domain window function, or may implement a half-filter response that starts at the peak value of the impulse response with the first sample and then decays to a substantially zero value. Because the burst operation and RESET signal described above enforce a known state in the modulator at the beginning of each conversion cycle for the lower sample rate, a half-filter response can be used for the digital low-pass filter 18. The half-filter response provides substantially the same result that would be had from a traditional filter response that receives twice the number of modulator samples, since the modulator is being reset at the start of each conversion cycle.

The present invention also provides the ability to easily multiplex the converter input, which is not present for converters employing continuously-operating modulators. For ADCs employing continuous modulator operation, if a new input of multiplexing sample/hold circuit 8 is selected, a conversion must be discarded due to the charge-injection involved in changing the multiplexing sample/hold circuit switch and the fact that delta-sigma modulator ADC 2 is continuously running during the settling of the input signal as applied to the internal sample/hold of multiplexing sample/hold circuit 8, i.e., the transient generated by the switching of multiplexing sample/hold circuit 8 will be reflected in the output of quantizer 14 for the conversion in which the input selection is changed. In converters in accordance with embodiments of the present invention, the input selected by multiplexing sample/hold circuit 8 may be changed at any point before the de-assertion of the modulator RESET signal that is sufficiently ahead of the time required to stabilize the analog loop filter, for example, the input can be changed at the time when the analog circuits are re-enabled.

In order to assure accurate operation when the converter is re-started at the lower sample rate, dither generator 15 includes a pattern matching circuit. When a code sequence from quantizer 14 indicates that the feedback value and the input signal value are close in value, e.g., when a sequence of constant values is produced by quantizer 14, the amplitude of the dither signal generated by dither generator 15 is increased until the output of quantizer 14 changes. After the change is detected, the output of dither generator 15 is restored to the nominal value. Generally, it is desirable to under-dither the quantizer, in order to provide the maximum possible dynamic range from the converter without instability in the modulator. However, when the input signal and the feedback value are the same or close in value, the quantizer output will not change, or will not change for a significant number of quantizer output values.

During the intermittent conversion of the present invention, at the beginning of modulator operation, the output of summer 13A starts at zero due to the resetting of the modulator prior to the clock signal burst, and therefore such long sequences of repeated code values are more frequent for low input signal values. Therefore, dither generator 15 or some other mechanism is needed to ensure that the quantizer does not produce long sequences of a single value during startup of the modulator. For that purpose, dither generator 15 is designed to detect the code(s) that indicate that the modulator loop is producing an unchanging sequence of quantizer output code values indicating that the quantizer is "stuck" at a particular quantization level, and an output signal that causes dither generator 15 to scale its output is provided. The extreme values (maximum and minimum outputs) of quantizer 14 are excluded from the unchanging code sequence detection, so that delta-sigma modulator 10 is not further de-stabilized by the addition of dither when delta-sigma modulator 10 is already operating in a potentially unstable condition indicated by the output of quantizer 14 assuming an extreme value.

Figure 3:
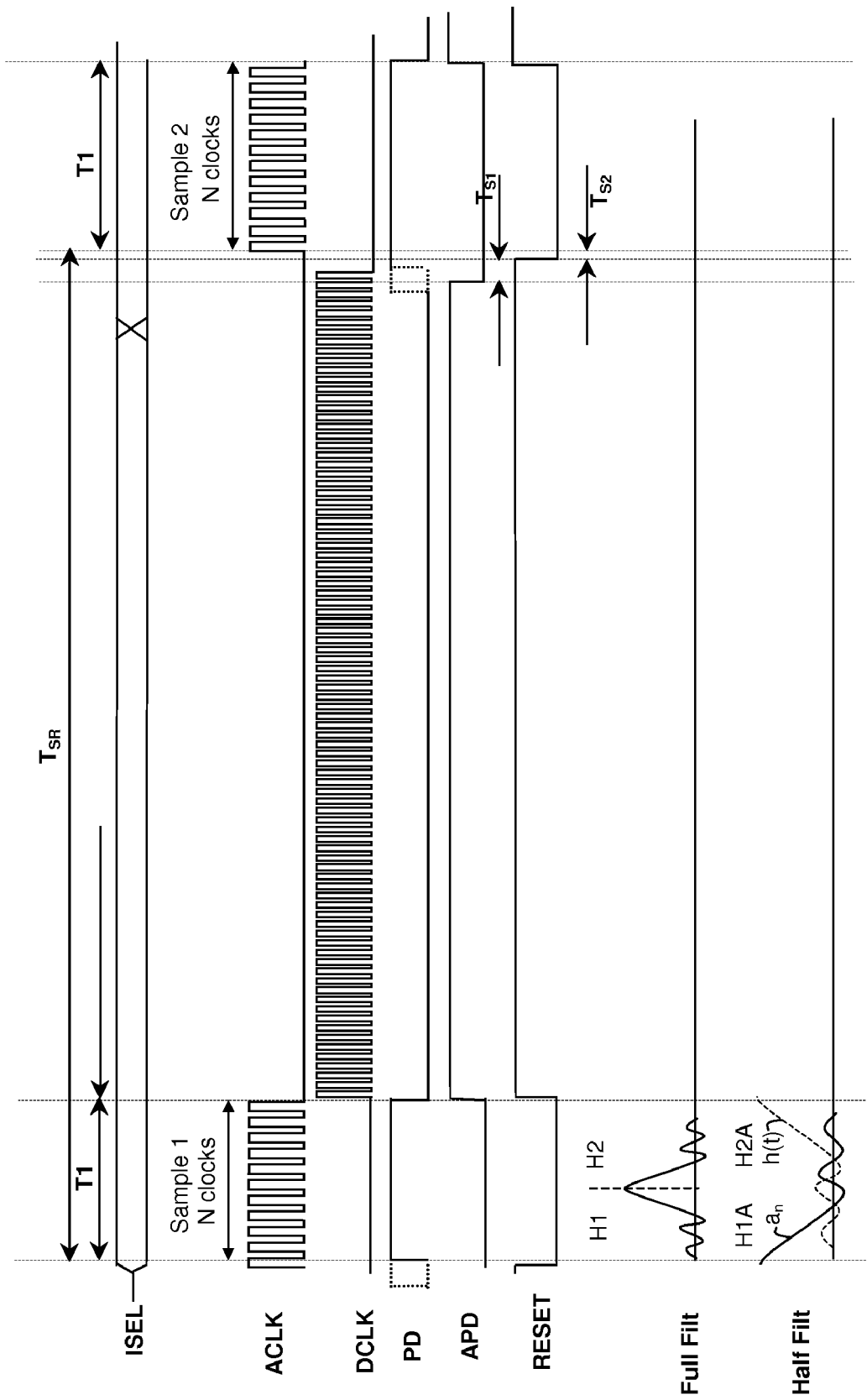
FIG. 3 is a signal timing diagram depicting signal relationships within the circuit of FIG. 1.

Referring now to FIG. 3, an exemplary diagram of signals within the circuits of FIG. 1 and FIG. 2 is shown. The signals are shown in time and voltage relationship with each other, to further demonstrate the operation of the present invention. The ADC clock signal ACLK is used to represent a single clock that operates the various digital portions of the ADC circuit 2 of FIG. 1 and FIG. 2. However, it is understood that the actual clocks used to operate the various blocks may constitute several clocks and the clocks may be of differing frequency. The clock bursts that intermittently operate quantizer 14 and digital low-pass filter 18 will generally be offset by at least one-half clock period so that valid output values of quantizer 14 are latched and subsequently operated on in first digital low-pass filter 18.

FIG. 3 depicts the interleaved digital and analog circuit operation of the present invention, in which time period T1 is the time to perform one conversion cycle, and time period $T_{SR}$ is the time between the start of conversion cycles, i.e. the sample rate period. Signal ISEL illustrates selection of an input signal by multiplexing sample/hold circuit 8, which is made between conversion cycles. Signal APD is the signal that enables the analog circuits in analog loop filter 11, which is enabled at a time $T_{s1}+T_{s2}$ prior to the start of the clock burst of clock signal ACLK. Signal RESET is de-asserted at time $T_{s2}$ prior to the start of the burst of clock signal ACLK to enable analog loop filter 11. Clock signal DCLK represents operation of the digital circuits that are disabled during delta-sigma ADC 2 conversion cycles and signal PD represents a control signal employed to disable the digital logic, such as a power down interrupt signal supplied to processor core 4.

Waveform Full Filt is representative of the coefficients and impulse response of the time-domain window function of digital low-pass filter 18, when implemented as a traditional window filter. The impulse response shown is provided by multiplying the sequence of quantizer 14 output values corresponding to each modulator clock of the clock signal ACLK burst with the coefficients of the window function shown as $a_n$. Waveform Half Filt is representative of the coefficients h(t) of the time-domain window function shown in a dashed line and the coefficient values a(n) shown in a solid line, of digital low-pass filter 18, when implemented as a half filter. The half-filter operation differs from the traditional window response, as illustrated by the asymmetric response shown with first half H1A having the peak coefficient placed at or near the first modulator sample (indicated by the first clock pulse of the clock burst of signal ACLK) and generally decreasing amplitude to the end of the clock burst, with a lower energy during half-interval H2A compared to half-interval H1A. The full filter response shown in waveform Full Filt has response halves H1 and H2 that are mirror images of each other.

Figure 4:
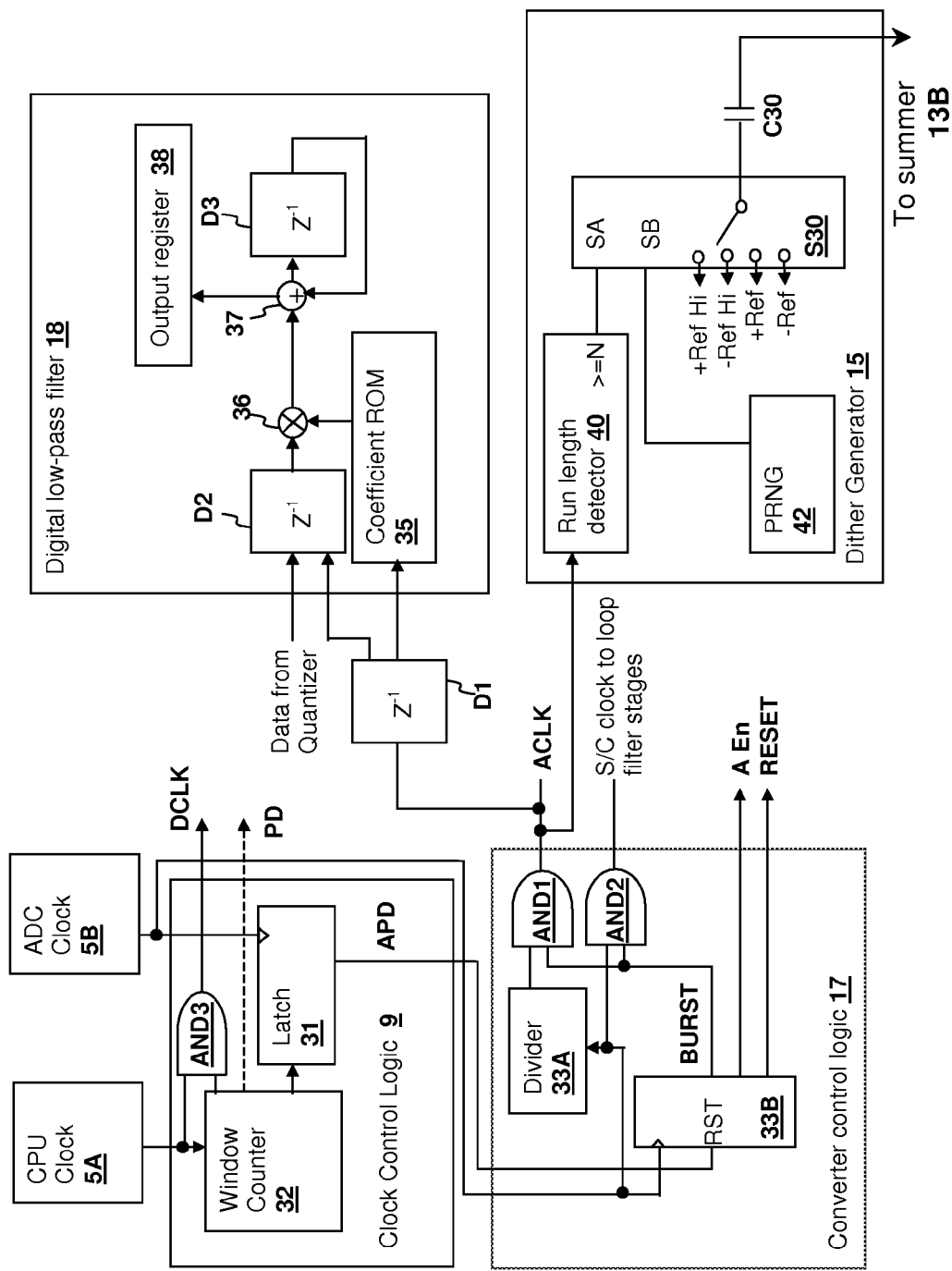
FIG. 4 is a block diagram depicting the structure of clock control logic 9 of FIG. 1 and converter control logic 17, digital low-pass filter 18, and dither generator 15 of FIG. 2.

Referring now to FIG. 4, details of clock control logic 9 of FIG. 1 and converter control logic 17, dither generator 15 and digital low-pass filter 18 of FIG. 2 are shown. Clock control logic 9 receives clock signals from CPU clock 5A and ADC clock 5B and provides control signal PD from a window counter 32 that generates the DCLK burst from CPU clock 5A via an AND gate AND3. A latch 31 is provided to generate the APD signal when control signal PD is de-asserted (digital logic running) in synchronization with the ADC clock 5B output signal. Within converter control logic 17, a divider 33A divides the output of ADC clock 5B to provide the modulator clock signal ACLK, which is qualified by an AND gate AND1 with the output of a counter 33B that sequences the analog assertion of analog enable signal A En and de-assertion of loop filter reset signal RESET, so that clock signal ACLK is produced only after the loop filter has powered-up and stabilized. An AND gate AND2 qualifies the ADC clock 5B output signal with an output of counter 33B to clock switched capacitor circuits in discrete-time implementations of analog loop filter 11.

Counter 33B provides the A En signal and RESET signals from an internal decode of its count value, so that the A En signal is activated several counts prior to the BURST signal being asserted, and the RESET signal is de-asserted after the A En signal is activated and just prior to the ACLK burst being enabled via AND gate AND1. A unit clock delay D1 delays the modulator clock to clock the values at the output of delta-sigma ADC 2 into latch D2, and also to clock coefficients from coefficient ROM 35. The output of coefficient ROM 35 and the output of latch D2 are multiplied by a multiplier 36 and summed by an adder 37 with accumulated previous addition results of adder 37 that are stored in latch D3. An output register 38 provides for latching the resultant accumulation of the products of the coefficients and the output values from delta-sigma modulator 10, resulting in the convolution that yields the low-pass filter output.

Details of dither generator 15 are also shown in FIG. 4. A run-length detector 40 provides an >=N output indicating that the last N codes have the same value. For example, for N=11, if 11 codes are received that all have the same value, the >=N output signal of run-length detector 40 is asserted. As mentioned above, run-length detector 40 is designed to ignore long runs of the extreme maximum or minimum codes, so that the >=N output is not activated if quantizer 14 is saturated. A pseudo-random number generator (PRNG) 42 provides a control output that operates the select SA of a multiplexer switch S30 that when the output of run length detector is low, alternates the polarity of a reference voltage (+Ref, −Ref) applied to capacitor C30. The output of run length detector 40 controls the select SB input of multiplexer switch S30 so that when a long run (e.g., 11 codes) of the same value are detected, the dither voltage is increased by alternating between another set of reference voltages (+Ref Hi, −Ref Hi). Exemplary values of dither correspond to +/−0.22 of a quantizer step for the normal dither level and a full quantizer step under unchanging quantizer output code conditions.

Figure 5A:
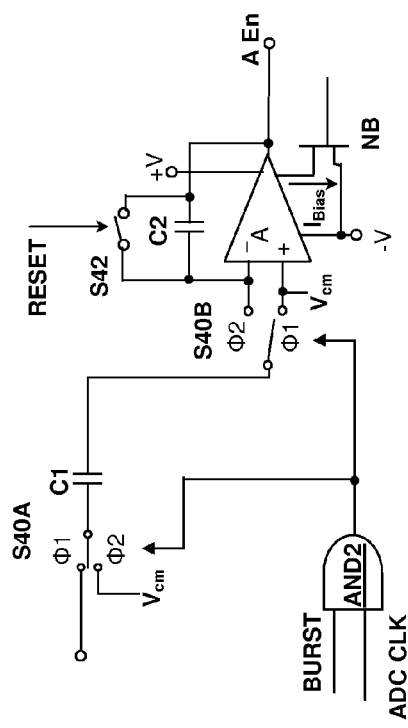
FIGS. 5A-5D are circuit diagrams of integrator stages that may be employed in an ADC of an SoC in accordance with an embodiment of the present invention.

Referring now to FIG. 5A, a switched-capacitor integrator stage that may be used to implement integrators 11A-11C of FIG. 2 is depicted. Although a single-ended switched-capacitor integrator is shown for simplicity, a fully differential switched-capacitor integrator stage is generally used in the converter. Switches S40A and S40B apply capacitor C1 alternatively to the input node of the stage and to the summing node of amplifier A, thus producing operation as a resistance. Feedback capacitor C2 in combination with the input resistance yields an integrator. Logical AND gate AND2 is shown as controlling the burst of pulses applied to switches S40A and S40B. Analog circuit enable signal A En is supplied to the gate of transistor NB, which controls the bias current levels $I_{Bias}$ in amplifier A. Amplifier A acts as an integrator as described above, and is reset by switch S42 in response to the RESET signal.

Figure 5B:
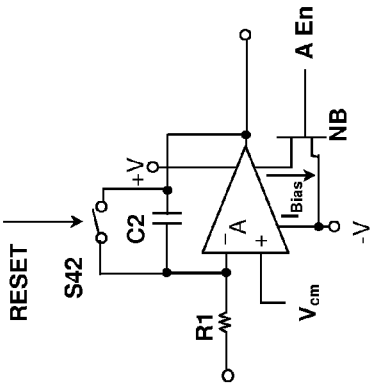

Referring now to FIG. 5B, a continuous time integrator that may be used as an alternative to the discrete-time circuit of FIG. 5A is shown. Only differences between circuits of FIGS. 5A and 5B will be described below. Rather than including a switched-capacitor input circuit, a resistor R1 is employed. Since capacitor C2 is held in a discharge state when the RESET signal is asserted, no additional modification to the circuit is necessary to reset the state of the integrator. However, in intermittent operating mode, the RESET signal in the circuit of FIG. 5B must be controlled such that it is released just as the conversion cycle is beginning in order to avoid drift, whereas in the circuit of FIG. 5A, integration of the applied input signal does not commence until the ABURST signal is asserted.

Figure 5C:
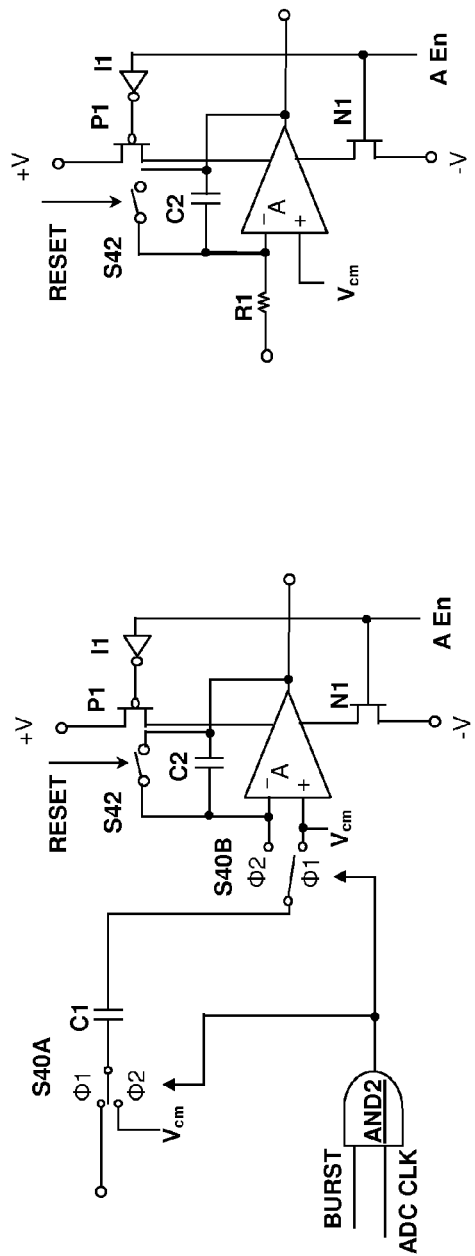

Referring now to FIG. 5C, an alternative method and apparatus for controlling the power consumption of amplifier A in the switched-capacitor integrator of FIG. 5A is illustrated. Rather than controlling the bias current of amplifier A, analog circuit enable signal A En is supplied to the gate of transistor N1 and an inverter I1 supplies an inverted version of signal A En to transistor P1, which controls the application of the analog power supplies to amplifier A, thus disabling the integrator.

Figure 5D:
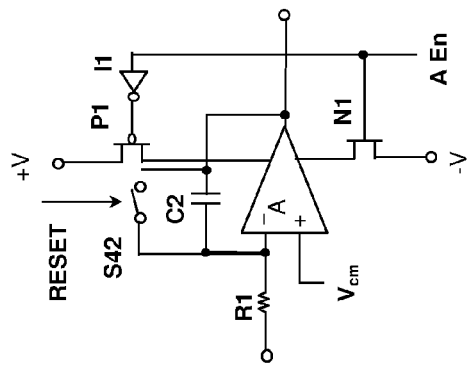

Referring now to FIG. 5D, an alternative method and apparatus for controlling the power consumption of amplifier A in the continuous-time integrator of FIG. 5B is illustrated. As in the circuit of FIG. 4C, analog circuit enable signal A En is supplied to the gate of transistor N1 and an inverter I1 supplies an inverted version of signal A En to transistor P1, which controls the application of the analog power supplies to amplifier A, thus disabling the integrator.

While the invention has been particularly shown and described with reference to the preferred embodiments thereof, it will be understood by those skilled in the art that the foregoing and other changes in form and details may be made therein without departing from the spirit and scope of the invention. For example, while the above-illustrated embodiments operate the digital logic exclusive of the operating period of the delta-sigma modulator, it is understood that degrees of improvement in noise reduction can be achieved by disabling the digital logic during only a portion of the ADC conversion cycle. Therefore, the present invention is understood to contemplate such variation from the disclosed embodiment.

What is claimed is:

1. An integrated circuit, comprising:
a delta-sigma modulator for receiving an analog input signal and providing a quantized digital output stream from a digital output;
a digital filter having an input coupled to said digital output of said delta-sigma modulator;
digital logic for receiving output sample values from said digital filter and performing further operations in accordance with said values; and
control logic for controlling operation of said delta-sigma modulator and said digital logic, wherein said control logic operates said delta-sigma modulator periodically at a constant modulator rate during operating intervals having a duration substantially less than a conversion period of the analog-to-digital converter and a repetition rate equal to the conversion rate of the analog-to-digital converter, and wherein said control logic further disables said digital logic during at least a portion of said operating intervals, whereby noise generated by said digital logic is prevented from affecting said output sample values.

2. The integrated circuit of claim 1, wherein said control logic disables said digital logic during an entirety of said operating intervals.

3. The integrated circuit of claim 1, wherein said digital logic comprises a second digital filter having an input coupled to an output of said digital filter for receiving an input sample produced by said delta-sigma modulator at the end of each operating interval.

4. The integrated circuit of claim 1, wherein said digital logic comprises a processor core.

5. The integrated circuit of claim 4, wherein said control logic is implemented by said processor core, wherein said processor core enables said operation of said delta-sigma modulator and halts processing of program instructions in order to enable said operation of said delta-sigma modulator while disabling said digital logic.

6. The integrated circuit of claim 5, wherein said processor core further sets a wake-up timer whereby said processor core resumes processing of program instructions after each operating interval is complete.

7. The integrated circuit of claim 1, wherein said control logic disables said digital logic by disabling a clock supplied to said digital logic.

8. The integrated circuit of claim 1, wherein said delta-sigma modulator comprises:
an analog loop filter; and
a quantizer having an input coupled to an output of said analog loop filter, and wherein said control logic provides periodic bursts of modulator clock signals to said quantizer during said operating intervals and resets said analog loop filter prior to each of said periodic bursts, whereby power consumption of said integrated circuit is reduced.

9. The integrated circuit of claim 8, wherein said control logic further provides periodic bursts of filter clock signals to said digital filter during said operating intervals.

10. The integrated circuit of claim 8, wherein said analog loop filter further includes a power control circuit for disabling amplifiers of said loop filter, wherein said power control circuit is coupled to said control logic, and wherein said control logic enables said amplifiers prior to each of said operating intervals and disables said amplifiers at the end of each of said operating intervals.

11. The integrated circuit of claim 1, wherein said digital filter has a time-domain window function such that an average value of an earlier half of said time-domain window function is substantially greater than that of an average value of a later half of said time-domain window function.

12. The analog-to-digital converter of claim 11, wherein said digital filter has a time-domain window function such that an initial coefficient of said time-domain window function is greater than any subsequent coefficient of said time-domain window function.

13. The integrated circuit of claim 1, wherein said delta-sigma modulator comprises:
an analog loop filter;
a quantizer having an input coupled to an output of said analog loop filter;
a run length detector for detecting a pattern of sequential identical levels received from an output of said quantizer; and
a dither generating circuit having an input coupled to an output of said quantizer and a dither output for providing a dither signal to an input of said quantizer, wherein a magnitude of said dither signal is controlled by said run length detector in operational dependence on a detected pattern of output samples of said quantizer.

14. A method of operating an integrated circuit including a delta-sigma modulator-based analog-to-digital converter and digital logic for performing operations on sample values produced by said analog-to-digital converter, said method comprising:
periodically operating a delta-sigma modulator at a constant modulator rate during operating intervals having a duration substantially less than a conversion period of said analog-to-digital converter and a repetition rate equal to a conversion rate of said analog-to-digital converter;
resetting analog circuits of said delta-sigma modulator prior to each operating interval;
disabling said digital logic during at least a portion of said operating intervals; and
operating said digital logic in between said operating intervals, whereby noise generated by said digital logic is prevented from affecting said sample values.

15. The method of claim 14, wherein said disabling disables said digital logic during an entirety of said operating intervals.

16. The method of claim 14, wherein said disabling disables a digital filter having an input for receiving input samples produced by an output of said delta-sigma modulator at the end of said operating intervals.

17. The method of claim 14, wherein said disabling halts execution within a processor core.

18. The method of claim 17, further comprising executing program instructions within said processor core that perform said periodically operating and said disabling.

19. The method of claim 18, further comprising setting a wake-up timer whereby said processor core resumes said execution of program instructions after said each period of said periodically operating is complete.

20. The method of claim 14, wherein said disabling is performed by disabling a clock supplied to said digital logic.

21. The method of claim 14, further comprising disabling said analog circuits during said operating said digital logic, whereby power consumption of said integrated circuit is reduced.

22. The method of claim 14, further comprising digitally filtering values produced by said delta-sigma modulator using a time-domain window function such that an average value of an earlier half of said time-domain window function is substantially greater than that of an average value of a later half of said time-domain window function.

23. The method of claim 22, wherein said time-domain window function has an initial coefficient greater than any subsequent coefficient of said time-domain window function.

24. The method of claim 14, further comprising:
detecting a pattern of sequential identical levels received from an output of said delta-sigma modulator; and
responsive to said detecting, adjusting a magnitude of dither applied to a quantizer of said delta-sigma modulator.

25. An integrated circuit, comprising:
a delta-sigma modulator for receiving an analog input signal and providing a quantized digital output stream from a digital output;
a digital filter having an input coupled to said digital output of said delta-sigma modulator;
a processor core for receiving output sample values from said digital filter and performing further operations in accordance with said values; and
control logic for controlling operation of said delta-sigma modulator and said digital logic, wherein said control logic operates said delta-sigma modulator periodically at a constant modulator rate during operating intervals having a duration substantially less than a conversion period of the analog-to-digital converter and a repetition rate equal to the conversion rate of the analog-to-digital converter, and wherein said control logic further disables said digital logic during at least a portion of said operating intervals, whereby noise generated by said digital logic is prevented from affecting said output sample values.

26. The integrated circuit of claim 25, wherein said control logic is implemented by said processor core.

* * * * *